(12) United States Patent
Wu et al.

(10) Patent No.: US 10,319,607 B2
(45) Date of Patent: Jun. 11, 2019

(54) PACKAGE-ON-PACKAGE STRUCTURE WITH ORGANIC INTERPOSER

(71) Applicant: Taiwan Semiconductor Manufacturing Company, Ltd., Hsin-Chu (TW)

(72) Inventors: Jiun Yi Wu, Zhongli (TW); Yu-Min Liang, Zhongli (TW); Mirng-Ji Lii, Sinpu Township (TW); Chien-Hsun Lee, Chu-tung Town (TW); Tsung-Ding Wang, Tainan (TW); Jung Wei Cheng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/466,647

(22) Filed: Aug. 22, 2014

(65) Prior Publication Data

US 2016/0056087 A1    Feb. 25, 2016

(51) Int. Cl.
*H01L 21/48* (2006.01)
*H01L 23/31* (2006.01)
(Continued)

(52) U.S. Cl.
CPC ........ *H01L 21/486* (2013.01); *H01L 23/3128* (2013.01); *H01L 23/49833* (2013.01); *H01L 25/105* (2013.01); *H01L 25/50* (2013.01); *H01L 23/49811* (2013.01); *H01L 23/49816* (2013.01); *H01L 23/49827* (2013.01); *H01L 24/13* (2013.01); *H01L 24/16* (2013.01); *H01L 24/32* (2013.01); *H01L 24/48* (2013.01); *H01L 24/73* (2013.01); *H01L 24/92* (2013.01); (Continued)

(58) Field of Classification Search
CPC . H01L 25/105; H01L 24/17; H01L 23/49816; H01L 23/49838; H01L 21/486; H01L 21/16; H01L 23/49833; H01L 23/3128; H01L 23/13; H01L 24/32; H01L 2224/32145; H01L 2225/1058; H01L 21/56; H01L 21/563; H01L 24/16; H01L 24/97
See application file for complete search history.

(56) References Cited

U.S. PATENT DOCUMENTS 7,049,692 B2 * 5/2006 Nishimura .......... H01L 23/3128
257/686
7,446,419 B1 * 11/2008 Lin ................... H01L 23/49805
257/777
(Continued)

*Primary Examiner* — Joseph C. Nicely
(74) *Attorney, Agent, or Firm* — Slater Matsil, LLP

(57) ABSTRACT

A device comprises a substrate having a die mounted on the first side of the substrate and a moldable underfill (MUF) disposed on the first side of the substrate and around the die. An interposer is mounted on the first side of the substrate, with the interposer having lands disposed on a first side of the interposer. The interposer mounted to the substrate by connectors bonded to a second side of the interposer, the connectors providing electrical connectivity between the interposer and the substrate. A package is mounted on the first side of the interposer and is electrically connected to the lands. At least one of the lands is aligned directly over the die and wherein a pitch of the connectors is different than a pitch of the lands.

20 Claims, 10 Drawing Sheets

(51) Int. Cl.
*H01L 25/10* (2006.01)
*H01L 25/00* (2006.01)
*H01L 23/498* (2006.01)
*H01L 23/00* (2006.01)

(52) U.S. Cl.
CPC ...... *H01L 2224/0401* (2013.01); *H01L 2224/131* (2013.01); *H01L 2224/16227* (2013.01); *H01L 2224/32145* (2013.01); *H01L 2224/32225* (2013.01); *H01L 2224/48091* (2013.01); *H01L 2224/48227* (2013.01); *H01L 2224/73204* (2013.01); *H01L 2224/73253* (2013.01); *H01L 2224/73265* (2013.01); *H01L 2224/92125* (2013.01); *H01L 2225/0651* (2013.01); *H01L 2225/06568* (2013.01); *H01L 2225/107* (2013.01); *H01L 2225/1023* (2013.01); *H01L 2225/1058* (2013.01); *H01L 2924/00014* (2013.01); *H01L 2924/15192* (2013.01); *H01L 2924/15311* (2013.01); *H01L 2924/15331* (2013.01); *H01L 2924/1815* (2013.01); *H01L 2924/18161* (2013.01); *H01L 2924/19105* (2013.01)

(56) References Cited

U.S. PATENT DOCUMENTS

| | | | |
|---|---|---|---|
| 7,777,351 B1* | 8/2010 | Berry | H01L 23/3128 257/778 |
| 8,012,797 B2* | 9/2011 | Shen | H01L 21/4853 438/107 |
| 8,372,741 B1* | 2/2013 | Co | H01L 24/03 219/56.22 |
| 8,405,212 B2* | 3/2013 | Chu | H01L 23/3128 257/738 |
| 8,658,464 B2* | 2/2014 | Cheng | B29C 39/10 257/778 |
| 8,779,606 B2* | 7/2014 | Yim | H01L 23/10 257/686 |
| 9,171,792 B2* | 10/2015 | Sun | H01L 25/16 |
| 9,209,156 B2* | 12/2015 | Len | H01L 24/05 |
| 9,214,454 B2* | 12/2015 | Haba | H01L 25/105 |
| 9,293,401 B2* | 3/2016 | Yoon | H01L 23/49811 |
| 9,343,387 B2* | 5/2016 | Hsu | H01L 23/3128 |
| 2004/0126927 A1* | 7/2004 | Lin | H01L 21/568 438/107 |
| 2007/0166993 A1* | 7/2007 | Lee | H01L 24/11 438/614 |
| 2007/0181989 A1* | 8/2007 | Corisis | H01L 21/561 257/686 |
| 2008/0017968 A1* | 1/2008 | Choi | H01L 21/565 257/686 |
| 2008/0073769 A1* | 3/2008 | Wu | H01L 21/56 257/686 |
| 2008/0157318 A1* | 7/2008 | Chow | H01L 23/3128 257/686 |
| 2008/0157326 A1* | 7/2008 | Han | H05K 3/3436 257/686 |
| 2008/0246163 A1* | 10/2008 | Tanida | H01L 21/563 257/778 |
| 2008/0251913 A1* | 10/2008 | Inomata | H01L 21/563 257/737 |
| 2008/0308950 A1* | 12/2008 | Yoo | H01L 25/16 257/778 |
| 2009/0057918 A1* | 3/2009 | Kim | H01L 25/0657 257/777 |
| 2009/0261465 A1* | 10/2009 | Shinagawa | H01L 23/49838 257/686 |
| 2010/0171205 A1* | 7/2010 | Chen | H01L 21/565 257/686 |
| 2010/0171207 A1* | 7/2010 | Shen | H01L 21/4853 257/686 |
| 2010/0304530 A1* | 12/2010 | Yim | H01L 23/04 438/109 |
| 2011/0068453 A1* | 3/2011 | Cho | H01L 21/565 257/686 |
| 2011/0117700 A1* | 5/2011 | Weng | H01L 21/56 438/109 |
| 2011/0241218 A1* | 10/2011 | Meyer | H01L 25/16 257/774 |
| 2011/0316150 A1* | 12/2011 | Ozawa | H01L 21/56 257/737 |
| 2011/0316151 A1* | 12/2011 | Ozawa | H01L 21/563 257/737 |
| 2012/0075268 A1* | 3/2012 | Chung | G02F 1/13452 345/204 |
| 2012/0211885 A1* | 8/2012 | Choi | H01L 23/3128 257/737 |
| 2012/0248439 A1* | 10/2012 | Lee | H01L 23/49838 257/48 |
| 2012/0280404 A1* | 11/2012 | Kwon | H01L 23/3737 257/777 |
| 2012/0305916 A1* | 12/2012 | Liu | H01L 22/34 257/48 |
| 2013/0075924 A1* | 3/2013 | Lin | H01L 24/19 257/774 |
| 2013/0105213 A1* | 5/2013 | Hu | H05K 3/4038 174/266 |
| 2013/0214423 A1* | 8/2013 | Sadaka | H01L 21/486 257/774 |
| 2013/0221521 A1* | 8/2013 | Yang | B23K 1/0016 257/737 |
| 2013/0256876 A1* | 10/2013 | Lee | H01L 24/14 257/737 |
| 2013/0270685 A1* | 10/2013 | Yim | H01L 23/10 257/686 |
| 2014/0063768 A1* | 3/2014 | Tanaka | H01L 23/3121 361/784 |
| 2014/0070406 A1* | 3/2014 | Mohammed | H01L 25/0652 257/737 |
| 2014/0091471 A1* | 4/2014 | Chen | H01L 24/19 257/770 |
| 2014/0102777 A1* | 4/2014 | Chen | H05K 3/4038 174/266 |
| 2014/0117557 A1* | 5/2014 | Chen | H01L 23/49822 257/774 |
| 2014/0291830 A1* | 10/2014 | Hwang | H01L 25/07 257/686 |
| 2015/0171002 A1* | 6/2015 | Jeon | H01L 21/481 257/698 |
| 2015/0279820 A1* | 10/2015 | Usami | H01L 25/0657 257/737 |
| 2015/0279823 A1* | 10/2015 | Haba | H01L 25/105 257/777 |
| 2016/0190035 A1* | 6/2016 | Na | H01L 23/367 257/712 |
| 2016/0284642 A1* | 9/2016 | Ganesan | H01L 23/3171 |
| 2017/0018468 A1* | 1/2017 | Gong | H01L 22/14 |
| 2017/0110393 A1* | 4/2017 | Tain | H01L 23/49827 |
| 2017/0160482 A1* | 6/2017 | Frankel | G02B 6/305 |
| 2017/0162523 A1* | 6/2017 | Hu | H01L 23/562 |
| 2017/0194249 A1* | 7/2017 | Chen | H01L 23/5226 |

\* cited by examiner

PACKAGE-ON-PACKAGE STRUCTURE WITH ORGANIC INTERPOSER

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. In some devices, multiple dies or packages with active devices or circuits are stacked vertically to reduce the footprint of a device package and permit dies with different processing technologies to be interconnected. Interconnections for this vertical stacking are created on the top and bottom surfaces of a substrate by forming redistribution layers (RDLs) with conductive lines in insulating layers. The RDLs, and the dies external to a particular package, are electrically connected to dies in a package, or dies on opposing sides of the package by vias extending through the substrate. The external packages are electrically connected to the RDL by conductive connectors disposed on lands exposed at the surface of the RDLs. Vias disposed in a substrate connect RDLs on opposite sides of a package.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
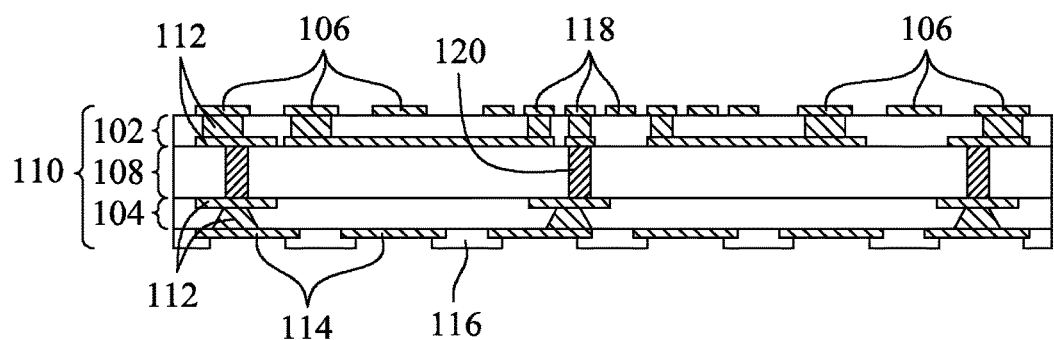
FIGS. 1 through 7 are cross-sectional views illustrating intermediate steps of a process for forming package-on-package structures in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

3D integrated circuits are formed by stacking multiple chips. Electrical connectivity for signals and power connections from external devices are provided to various levels of the package by vertical interconnections. Described herein is a structure having reduced interconnection pitch between levels. It has been discovered that conductive pillars between a lower substrate and an interposer permit the pillars between the lower substrate and the interposer to be closer together than other types of interconnections. The interposer provides a surface for mounting additional packages having a different pitch than the pillars. Furthermore, the interposer permits connections to be aligned directly over lower dies to increase the number of connections for overlying packages.

FIG. 1 is a cross-sectional view illustrating a substrate 110 according to some embodiments. The substrate 110 has a first redistribution layer (RDL) 102 and a second RDL 104 disposed on opposite sides of a substrate layer 108. The substrate layer 108 has one or more vias 120 extending from the top surface of the substrate layer 108 to the bottom surface of the substrate layer 108. The vias 120 connect conductive features 112 in the top RDL 102 to conductive features 112 in the bottom RDL 104. The bottom RDL 104 and top RDL 102 each have one or more insulating layers with the conductive features 112 disposed therein. The top RDL 102 has one or more lands 106 disposed on the top surfaces. Die lands 118 are disposed on the top surface of the top RDL 102. In some embodiments, the die lands 118 are disposed between lands, and in some embodiments, the die lands 118 have a different pitch than the lands 106. As discussed in greater detail below, a die is mounted to the die lands, while pillars are formed on the lands 106. The bottom RDL 104 also has lands 114 disposed on a bottom surface. In some embodiments, a protective layer 116 is disposed over the lands 114 on the bottom surface of the bottom RDL 104 and has openings exposing surfaces of the lands 114.

In an embodiment, substrate 110 is formed by forming the bottom RDL 104 first, with the substrate layer 108 formed over the bottom RDL 104 and the top RDL 102 subsequently formed over the substrate layer 108. The RDLs 102 and 104 are formed by metal layer deposition and patterning by, for example, deposition of a seed layer, masking and deposition of metal over the patterned mask. The mask and exposed portions of the seed layer are removed, and a dielectric layer such as PBO, polyimide, or the like is formed around the patterned metal elements. The process is repeated to form additional layers, with the metal features in each layer aligning with metal elements in adjacent metal features to form conductive elements 112.

The substrate layer 108 is formed over the bottom RDL 104 and is an electrically insulating layer such as an oxide, a nitride, a molding compound, polybenzoxazole (PBO), epoxy, polyimide, polymer or the like with conductive vias 120 in the insulating layer. In some embodiments, the substrate layer 108 is formed by forming the vias 120 first and then forming an insulating material around the vias. For example, the vias 120 are formed by plating a metal layer in openings in a patterned mask, by placing preformed vias on a carrier, or the like, with the substrate layer 108 formed around the vias. In other embodiments, the substrate layer 108 is formed prior to the vias 120 by molding, deposition such as chemical vapor deposition (CVD), plasma enhanced CVD (PECVD), thermal oxidation, or the like, with the vias 120 formed after the substrate layer 108 is formed. In such an embodiment, the substrate layer 108 is formed with openings for the vias 120 in place, such as with a molding chase, or the substrate layer 108 is formed and via openings are formed after forming the substrate layer 108 using a process such as laser drilling, etching or the like. The vias 120 are formed by plating or otherwise depositing metal in the via openings formed in the substrate layer 108.

In other embodiments, the substrate layer 108 is formed first, with the top RDL 102 and bottom RDL 104 formed on respective surfaces of the substrate layer 108. In such an embodiment, the substrate layer 108 is formed on a carrier or other support surface with bottom RDL layers (such as metal traces or copper foil) on opposite sides of the substrate layer 108. Alternatively, in an embodiment in which the substrate layer 108 is formed of an organic material, such as polymer impregnated glass-fiber laminate with bottom RDL layers (such as metal traces or copper foil) on its opposite surfaces, the substrate layer 108 itself can be used as a support in subsequent processing steps. Either the top RDL 102 or bottom RDL 104 is formed starting with the bottom RDL layer on the substrate layer 108. The RDL is built up layer by layer as described above. Substrate layer 108 is inverted, and the RDL on the opposing side is formed from the bottom layer up according to the process described above.

Figure 2:
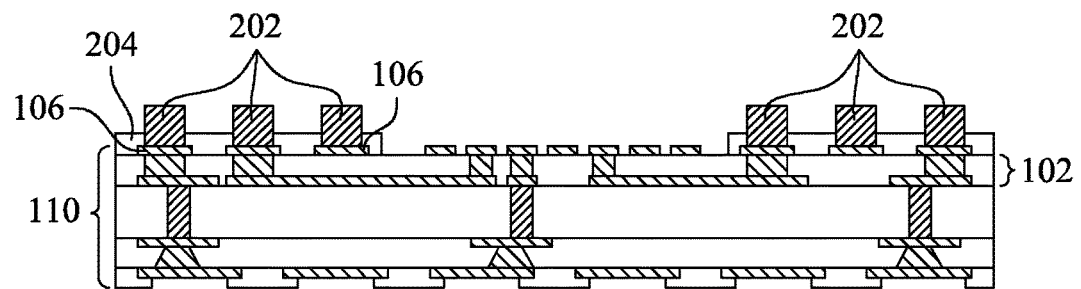

FIG. 2 is a cross-sectional view illustrating formation of pillars 202 on the substrate 110 according to some embodiments. In some embodiments, the pillars 202 are formed by initially depositing a seed layer over the lands 106. The seed layer is formed from copper (Cu), titanium (Ti), aluminum (Al), an alloy of the same, or another conductive material. The seed layer is formed by, for example, electroless copper deposition, atomic layer deposition, physical vapor deposition (PVD) by sputtering Ti, Cu, or another deposition process. A mask layer is formed over the seed layer from a material such as a photoresist or the like. The mask layer is patterned to form openings exposing the lands 106 by, for example, exposing and developing a photoresist mask layer. A metal layer is formed over the patterned mask layer by, for example physical vapor deposition, electroless plating, seed layer deposition by ALD and electroplating, or by another metal formation process. In some embodiments, the deposited metal layer is planarized by, for example, a chemical-mechanical polish (CMP), grinding, etching, or the like. The planarization step removes excess deposited metal from over the patterned mask layer, leaving pillars 202. The mask layer is then removed by, for example, chemical stripping or ashing with a plasma oxygen treatment. The seed layer outside of the pillars 202 subsequently removed by etching or the like. In some embodiments, a tin (Sn) plating layer is applied over the pillars 202, with the tin reflowed after etching or otherwise removing the excess seed layer material.

In some embodiments, the pillars 202 are formed with a pitch between adjacent pillars that is between about 200 μm and about 400 μm. It has been discovered that pillars 202 with the aforementioned pitch provide a spacing between pillars 202 that reduces or prevents bridging between adjacent pillars. In particular, the pitch range described above results in spacing such that a solder connecting member connecting the pillars 202 on the substrate 110 to pillars on a subsequently mounted interposer (see, FIG. 4, elements 402, 414, 416). Additionally, in some embodiments, the pillars 202 are formed with a round cross-sectional shape with a diameter between about 120 μm and about 240 μm and a height that is about equal to, or less than, the diameter of the pillars 202. It has been discovered that such a height and ratio of width-to-height permits formation of the pillars 202 by plating and prevents voids in the pillars 202. Additionally, such a range of widths for the pillars 202 provides a width and spacing at the described pitch to prevent bridging of connecting members that are subsequently formed on the pillars.

A solder resist layer 204 is formed around the pillars 202, with the pillars 202 exposed through the top surface of the solder resist layer 204. In some embodiments, the solder resist layer 204 is an epoxy based polymer, PBO, oxide, nitride, or another material. In some embodiments, the solder resist layer 204 is formed after the pillars 202 are formed. In such an embodiment, the solder resist layer 204 is formed around the pillars 202. In other embodiments, the solder resist layer 204 is formed prior to forming pillars 202. In such an embodiment, the solder resist layer 204 is formed with openings over the lands 106 for the pillars 202 using a process such as molding, deposition and etching or laser drilling, or another process, and the pillars 202 are formed in the openings over the lands 106. The solder resist layer 204 has an additional opening exposing the die lands 118, permitting a die to be mounted in the die lands 118 in subsequent processing steps.

Figure 3:
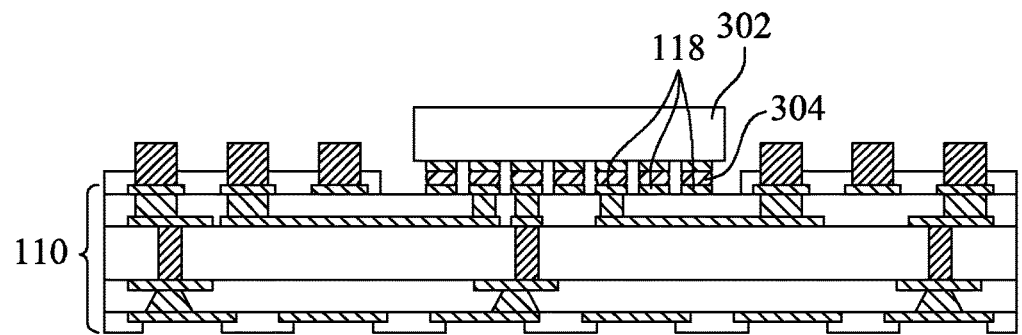

FIG. 3 is a cross-sectional view illustrating mounting a die 302 on the substrate 110 according to some embodiments. In some embodiments, the die 302 has one or more active or passive devices such as transistors, inductors, capacitors, resistors or the like disposed therein. The die 302 is attached to the die lands 118 by, for example, a flip-chip bonding technique. In some embodiments, connectors 304 are disposed between contact pads on the die 302 and the die lands 118. The connectors 304 bond the die 302 to the die lands 118 while providing electrical connections between the die 302 and the die lands 118. In some embodiments, the connectors 304 are solder balls, controlled collapse chip connections (C4), a land grid array, microbumps, pillars, studs, or the like.

Figure 4:
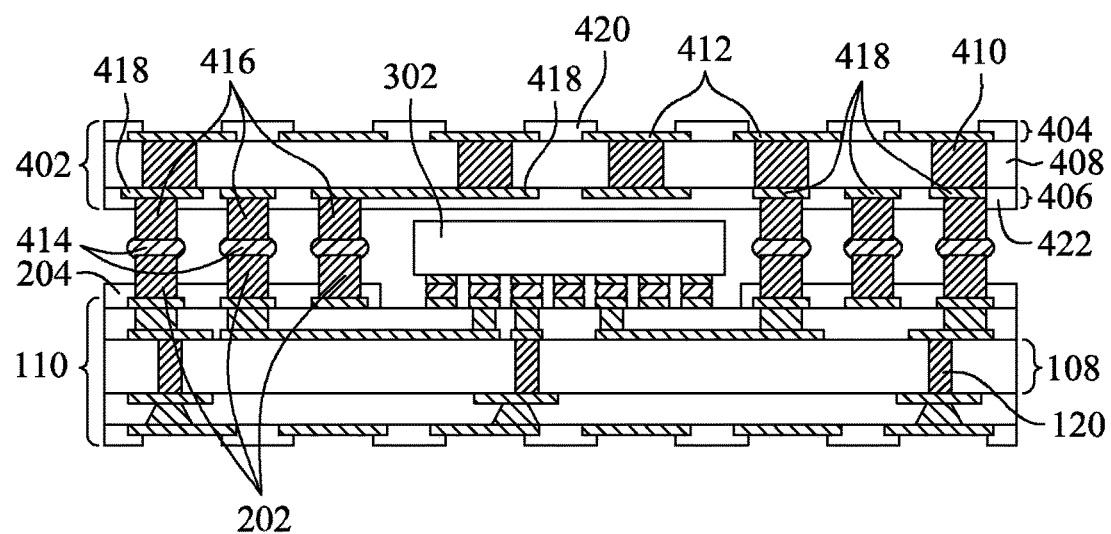

FIG. 4 is a cross-sectional view illustrating mounting an interposer 402 on the substrate 110 according to some embodiments. In an interposer first process, an interposer 402 is initially provided and mounted over the substrate 110 by attaching pillars 416 on the interposer 402 to the pillars 202 on the substrate 110. The interposer 402 has an interposer substrate 408 with a top RDL 404 and bottom RDL 406 disposed on the top and bottom surfaces of the interposer substrate 408. Vias 410 in the interposer substrate 408 connect the bottom RDL 406 to the top RDL 404.

The interposer substrate 408 is formed, in some embodiments, from an organic material such as an epoxy impregnated glass-fiber laminate, polymer impregnated glass-fiber laminate, preimpregnated composite fiber, Ajinomoto build-up film (ABF), molding compound, epoxy, PBO, polyimide or another organic material. It has been discovered that an interposer with an organic interposer substrate 408 provides a structure with a coefficient of thermal expansion (CTE) that more closely matches the CTE of a substrate 110 than an inorganic interposer substrate 408. It should be understood that the matching of the CTEs for the interposer 402 will depend on the materials used for the substrate 110. However, the interposer substrate 408 is not limited to such material, as in other embodiments, the interposer substrate 408 is formed from an oxide, oxynitride, nitride, or another insulating material. The interposer substrate 408 and vias 410 are formed, in some embodiments as described above with respect to the substrate layer 108 and vias 120.

In some embodiments, the interposer substrate 408 is formed first, with the top RDL 404 and bottom RDL 406 subsequently formed, respectively, on the top surface and bottom surface of the interposer substrate 408. In other embodiments, the interposer 402 is formed by forming the top RDL 404 or bottom RDL 406 on a carrier or the like, with the interposer substrate 408 formed on the first formed RDL 404/406 and the remaining RDL 404/406 formed over the interposer substrate 408.

The RDLs 404 and 406 are formed as described above with respect to RDLs 102 and 104. While the top RDL 404 and bottom RDL 406 of the interposer 402 are illustrated as each having a single layer of conductive features, the RDLs 404 and 406 are not limited to such structures, as the RDLs 404 and 406, in some embodiments, have multiple conductive features and dielectric layers. The conductive features in the bottom RDL 406 comprise lands 418 that are exposed at the bottom side of the interposer 402 by openings in an overlying protection layer 422. The protection layer 420 on the top RDL 404 has openings exposing lands 412 for subsequent mounting of an external device such as a die, package, board, device or the like.

It has been discovered that the interposer 402 having lands 412 on the top surface that are disposed over the die 302 permits connectors for subsequently formed devices to have a pitch that is different than the pitch of the pillars 416. In particular, a larger pitch for the lands 412 permits greater spacing of the connectors on the lands 412, preventing solder bridging between adjacent connectors, and permitting larger connectors. Additionally, the lands 412 being disposed over the die 302 allows for a greater number of lands 412 and associated connectors than the number of pillars 416. In some embodiments, the lands 412 have exposed regions with a diameter between about 200 µm and about 400 µm and a pitch between about 350 µm and about 650 µm.

Pillars 416 are disposed on the lands 418 and extend through the openings in the protection layer 422. In some embodiments, the pillars 416 are formed as described above with respect the pillars 202, with the pillars 416 formed over the protection layer 422 instead of over the solder resist 204. In some embodiments, the pillars 416 on the interposer 402 are formed to have about the same size and pitch as the pillars 202 on the substrate 110, and with a complementary arrangement so that pillars 416 align with pillars 202 when the interposer 402 is mounted on the substrate 110.

The interposer 402 is mounted to the substrate 110 by aligning the pillars 416 over the pillars 202 and bonding the aligned pairs of pillars 202 and 416 to each other. In some embodiments, a connecting member 414, such as a solder cap, tin layer, or other conductive material is used to joining the aligned ends of the pillars 202 and 416. The connecting member is, for example, formed on one set of pillars 202 or 416 prior to the pillars 202 and 416 being connected. The pillars 202 and 416 are then brought together, and the connecting member 414 is subjected to heat and/or pressure to reflow the material of the connecting member 414 or otherwise bond the aligned pairs of pillars 202 and 416.

Figure 5:
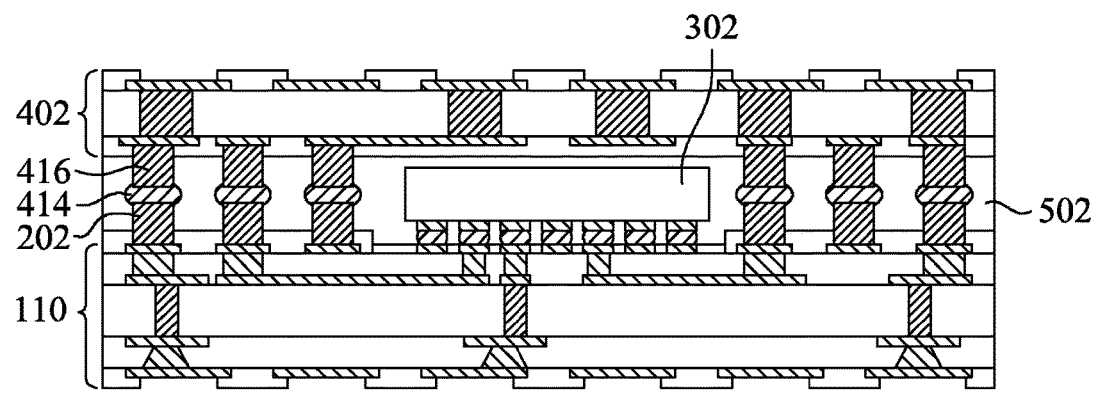

FIG. 5 is a cross-sectional view illustrating application of a moldable underfill (MUF) 502 according to some embodiments. In the interposer first process, the interposer 402 is mounted to the substrate 110 and the MUF 502 is formed between the joined interposer 402 and substrate 110. In some embodiments, the MUF 502 is a molding compound, epoxy, PBO, polyimide or another moldable insulating material. The MUF 502 is injected between the interposer 402 and the substrate 110 and retained in place by way of a mold or the like during application and curing. In such an embodiment, the MUF 502 contacts the sidewalls of the pillars 202 and 416 and surrounds the pillars 202, connecting members 414 and pillars 416. Additionally, the MUF 502 contacts and extends from the top surface of the substrate 110 to contact the bottom surface of the interposer 402. In some embodiments, the top surface of the die 302 is spaced apart from the bottom surface of the interposer 402, and a portion of the MUF 502 is disposed in the space between the die 302 and the interposer 402. In some embodiments, a portion of the MUF 502 extends between the die 302 and the substrate 110.

Figure 6:
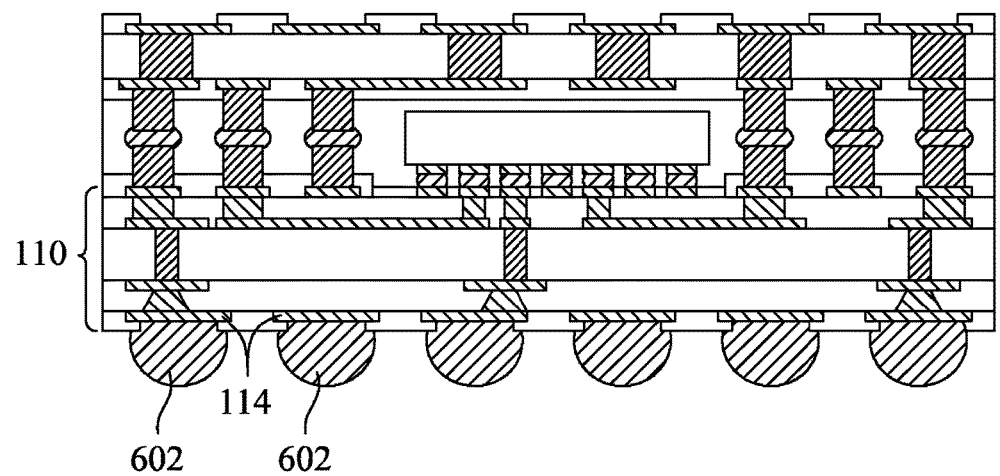

FIG. 6 is a cross-sectional view illustrating mounting connectors 602 on the substrate 110 according to some embodiments. Connectors 602, such as, for example, solder balls, are mounted on the lands 114. In other embodiments, the connectors 602 are conductive bumps, pillars, studs or another conductive structure.

Figure 7:
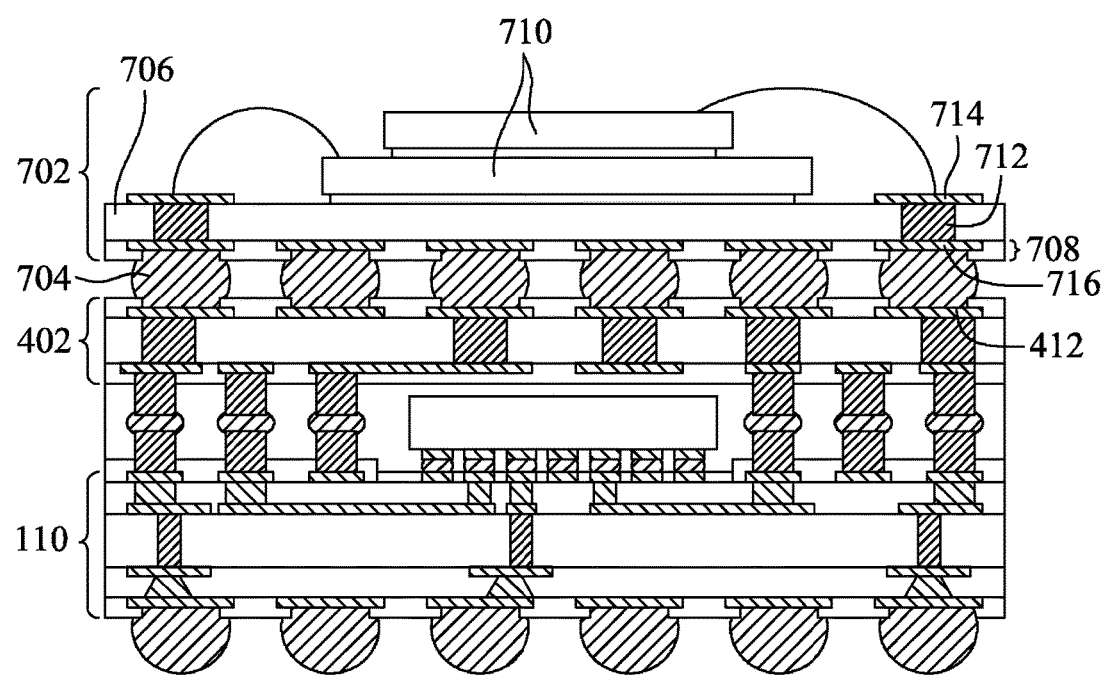

FIG. 7 is a cross-sectional view illustrating mounting a package 702 on the interposer 402 according to some embodiments. Package connectors 704 such as, for example, solder balls, pillars, studs, conductive bumps, or the like bond the package 702 to the interposer 402. The connectors 704 electrically connect the lands 412 on the top surface of the interposer 402 to the lands 716 on the bottom surface of the package 702. In some embodiments, the package 702 has one or more dies 710 electrically connected to conductive features 714 that are in turn electrically connected to the lands 716 by way of vias 712 disposed in a package substrate 706.

While the package 702 is illustrated herein as having a substrate 706 with dies 710 disposed thereon, the structure is not limited to having such a package 702 with such an arrangement. In other embodiments, the package 702 is a die or chip mounted directly on the connectors 704, multiple dies or packages on the connectors 704 or another arrangement.

Figure 8:
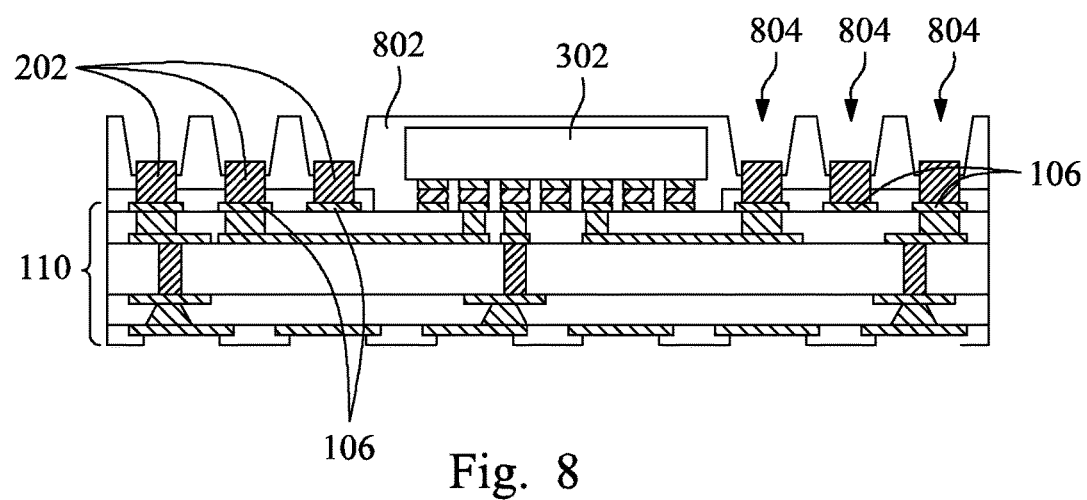
FIGS. 8 through 10 are cross-sectional views illustrating intermediate steps of a process for forming package-on-package structures in accordance with some embodiments.
Figure 9:
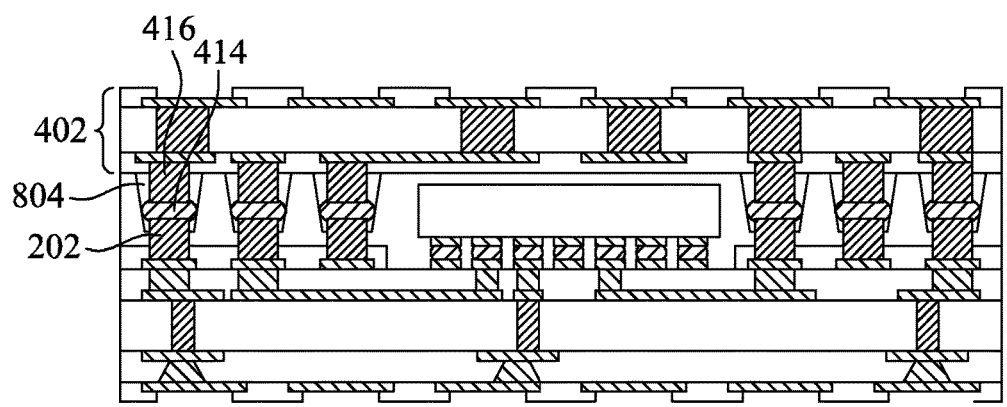
Figure 10:
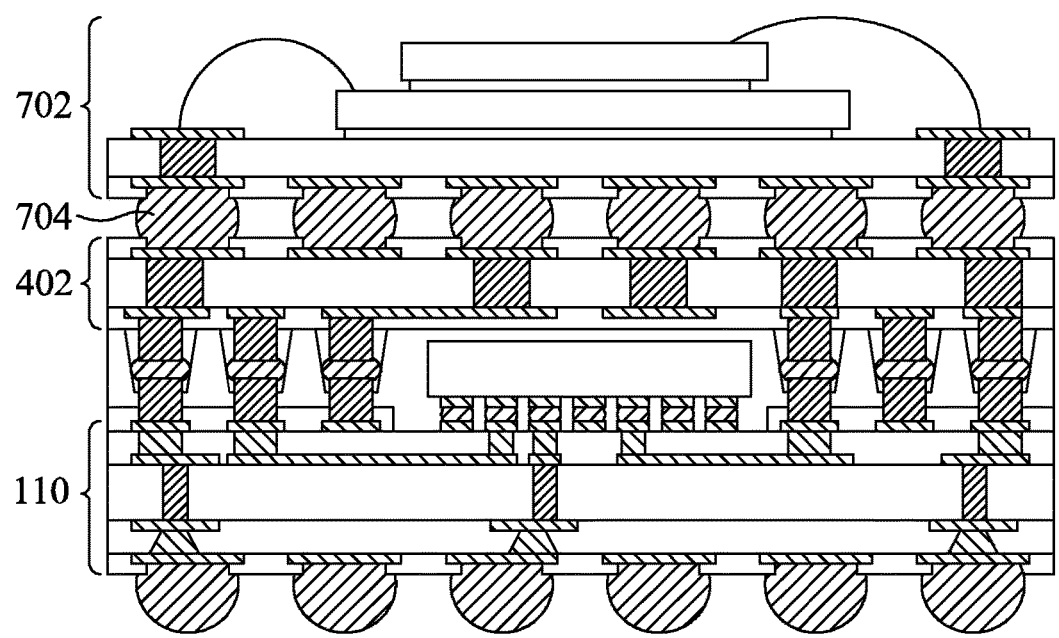

While FIGS. 1 through 7 describe a process for forming the described structure using an interposer first process, in other embodiments, an interposer last process is employed to form the structure. In such embodiments, the MUF 502 is formed prior to mounting the interposer 402 to the substrate 110, as shown in FIGS. 8 through 10. FIG. 8 is a cross-sectional view illustrating formation of an MUF 802 prior to mounting the interposer 402 according to some embodiments. The MUF 802 is formed after the die 302 is mounted to the substrate 110 as shown in FIGS. 1 and 3, and in some embodiments, the MUF 802 is also formed after formation of the pillars 202 as shown in FIG. 2. In such embodiments, the MUF 802 is formed with openings 804 exposing the pillars 202. The openings 804 are formed by patterning the MUF 802 using a molding chase or another process to form the openings 804 during the molding process. In other embodiments, the MUF 802 is formed over the die 302 and pillars 202 and openings 804 are formed after forming the MUF 802 by, for example, laser drilling, etching or the like. In some embodiments, the openings 804 are conical, with the upper portion of the openings 804 at the top surface of the MUF 802 being wider than the lower portion of the openings 804. In other embodiments, the openings 804 are cylindrical, rectangular, or another shape.

In other embodiments, the pillars 202 are formed after forming the MUF 802 and openings in the MUF 802. In an embodiment, the openings 804 expose a portion of the lands 106. The pillars 202 are subsequently formed on the lands 106 and in the openings 804.

FIG. 9 is a cross-sectional view illustrating mounting of the interposer 402 on the substrate 110 after formation of the MUF 802 according to some embodiments. In such embodiments, pillars 416 extend into the openings 804, with the connecting members 414 disposed in the openings 804. The sidewalls of the openings 804 are, in some embodiments, spaced apart from the sidewalls of the pillars 202 and 416.

FIG. 10 is a cross-sectional view illustrating mounting of the package 702 on the interposer 402 in an interposer last process according to some embodiments. The package 702 is mounted to the interposer by connectors 704, as described above.

Figure 11A:
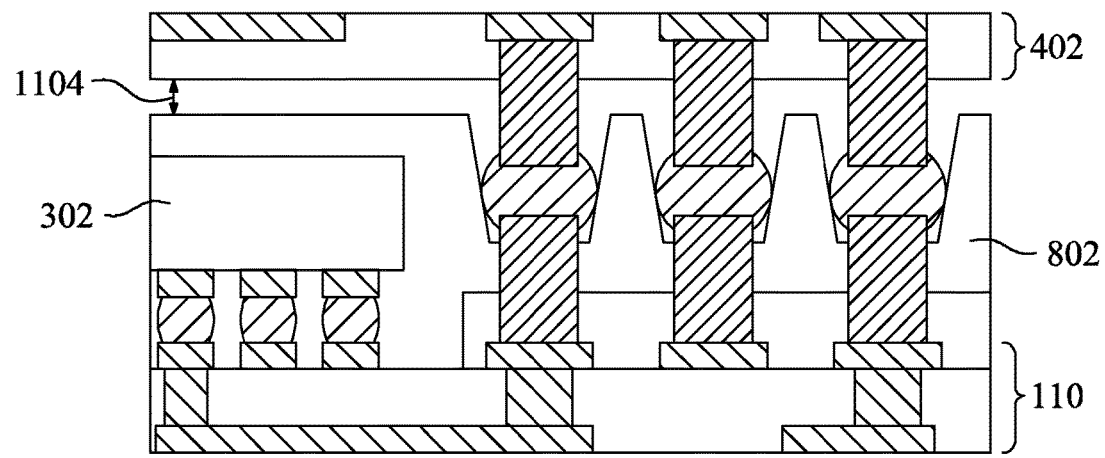
FIGS. 11A through 11D are cross-sectional enlarged views illustrating various embodiments of an interposer over a die in a package-on-package structure.

While FIGS. 1 through 10 illustrate the MUF 802 extending to the bottom surface of the interposer 402, over the die 302 and under the die 302, the structure is not limited to such embodiments. FIGS. 11A through 11D are cross-sectional enlarged views illustrating various embodiments of an interposer 402 over a die 302 and MUF 802. FIG. 11A is a cross sectional enlarged view illustrating a MUF 802 over the die 302 and spaced apart from the interposer 402 according to some embodiments. In such embodiments, the MUF 802 is formed by the interposer last process, with the MUF 802 molded to cover the die 302. The MUF 802 is spaced apart from the bottom surface of the interposer 402 by an air gap 1104 having a distance less than the separation between the top surface of the die 302 and the bottom surface of the interposer 402. In some embodiments, the air gap 1104 helps the pillars 202 and 416 successfully bond to each other without being influenced by the height and surface uniformity of MUF 802 in the interposer last process.

Figure 11B:
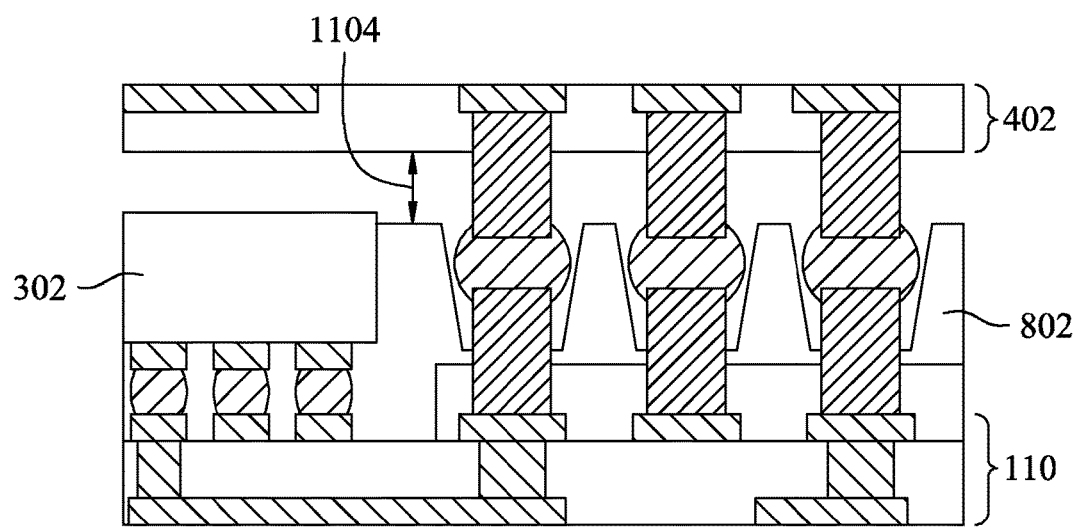

FIG. 11B is a cross-sectional enlarged view illustrating the die 302 extending above the MUF 802 according to some embodiments. In such embodiments, the MUF is formed by the interposer last process, with the MUF 802 molded around the die 302. The die 302 has a top surface that is exposed through the top surface of the MUF 802. The MUF 802 is spaced apart from the bottom surface of the interposer 402 by an air gap 1104 having a distance equal to, or greater than, the separation between the top surface of the die 302 and the bottom surface of the interposer 402.

Figure 11C:
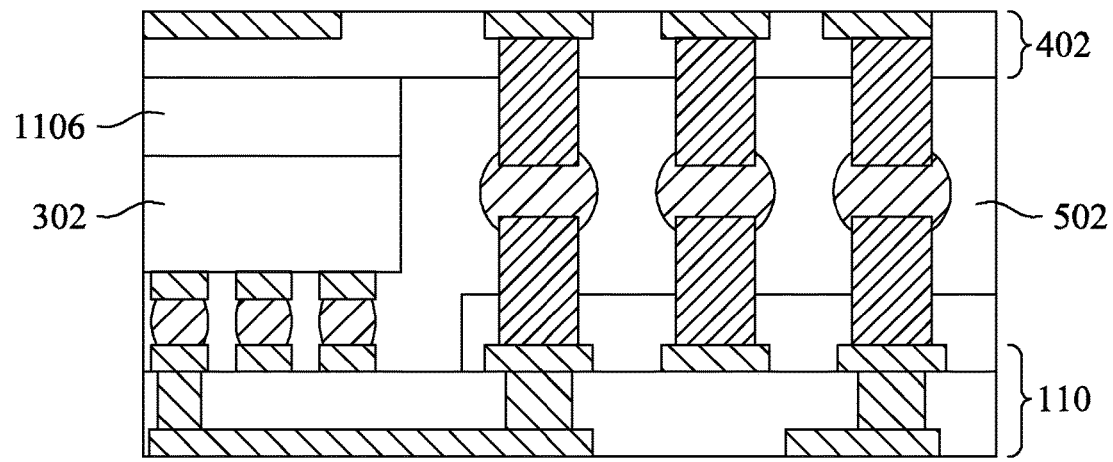

FIG. 11C is a cross-sectional enlarged view illustrating a die attachment film (DAF) 1106 disposed on the top surface of the die 302 according to some embodiments. In some embodiments, the die 302 is attached to the interposer prior to the die 302 being mounted to the substrate 110. In such embodiments, the die 302 is mounted to the substrate 110 when the interposer 402 is mounted to the substrate 110. In other embodiments, the DAF 1106 is applied to the die 302 or to the interposer after the die 302 is mounted to the substrate 110 and prior to the interposer 402 being mounted to the substrate 110. The die 302 is bonded to the interposer 402 by the DAF 1106 when the interposer 402 is mounted to the substrate 110. In some embodiments, the DAF 1106 is a different material than the MUF 502. The DAF 1106 reduces warping of the interposer and improves heat transfer from the die 302 during operation.

Figure 11D:
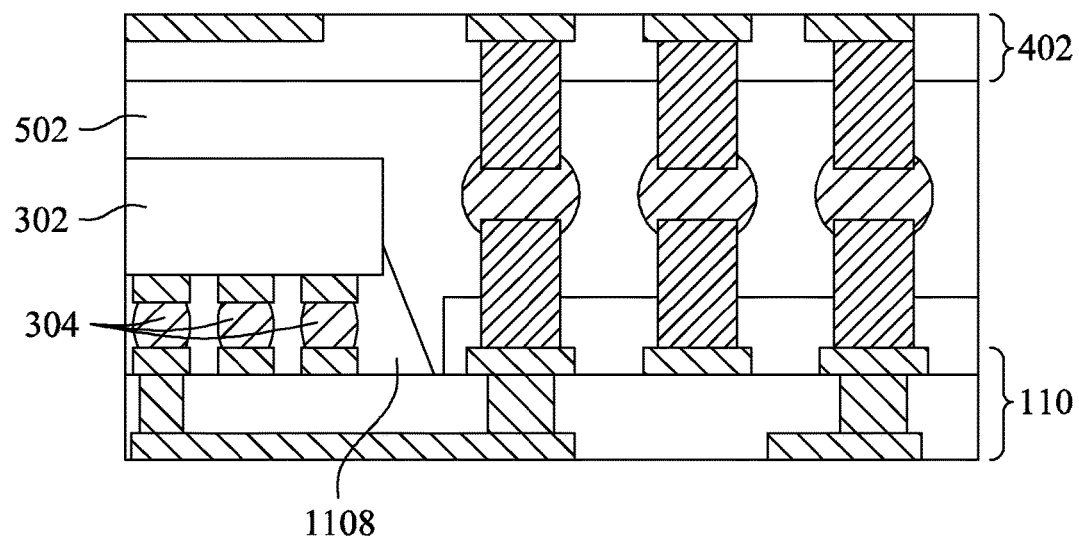

FIG. 11D is a cross-sectional enlarged view illustrating an underfill (UF) 1108 disposed between the die 302 and the substrate 110. The UF 1108 is a molding compound, epoxy, PBO, polyimide or another moldable insulating material, and in some embodiments, the UF 1108 is a different material than the MUF 502. In some embodiments the UF 1108 is dispensed along the bottom edge of the die 302, so that the UF 1108 will flow and fill the space in between the bottom of die 302 and the substrate 110 through capillary effect. In some embodiments, the UF 1108 is applied between the die 302 and the substrate 110 prior to the MUF 502 being applied, and in other embodiments, the MUF 502 is omitted so that the side surfaces of the UF 1108 are exposed.

Figure 12A:
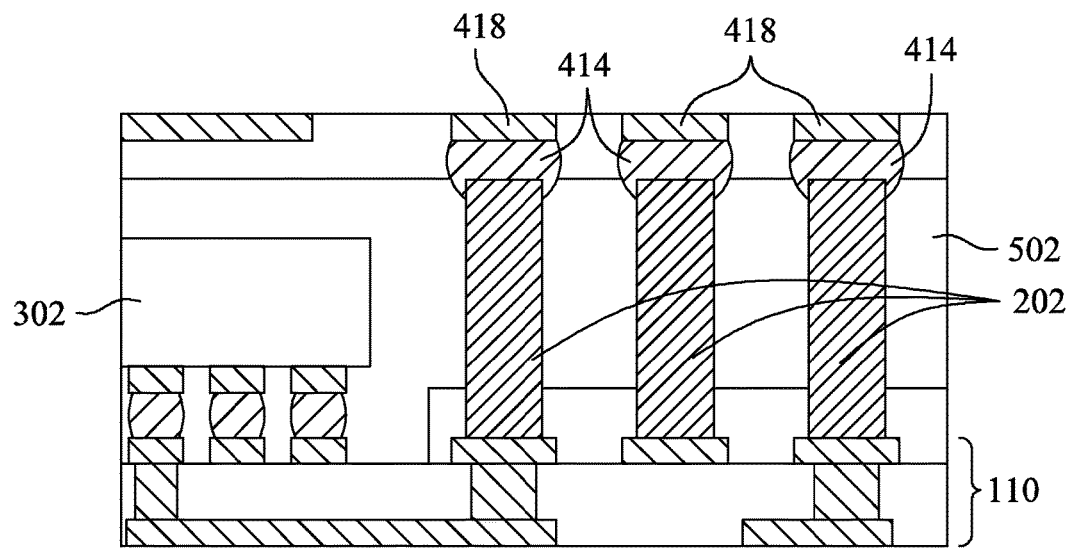
FIGS. 12A through 12B are cross-sectional enlarged view illustrating various embodiments of pillar connectors arrangements.
Figure 12B:
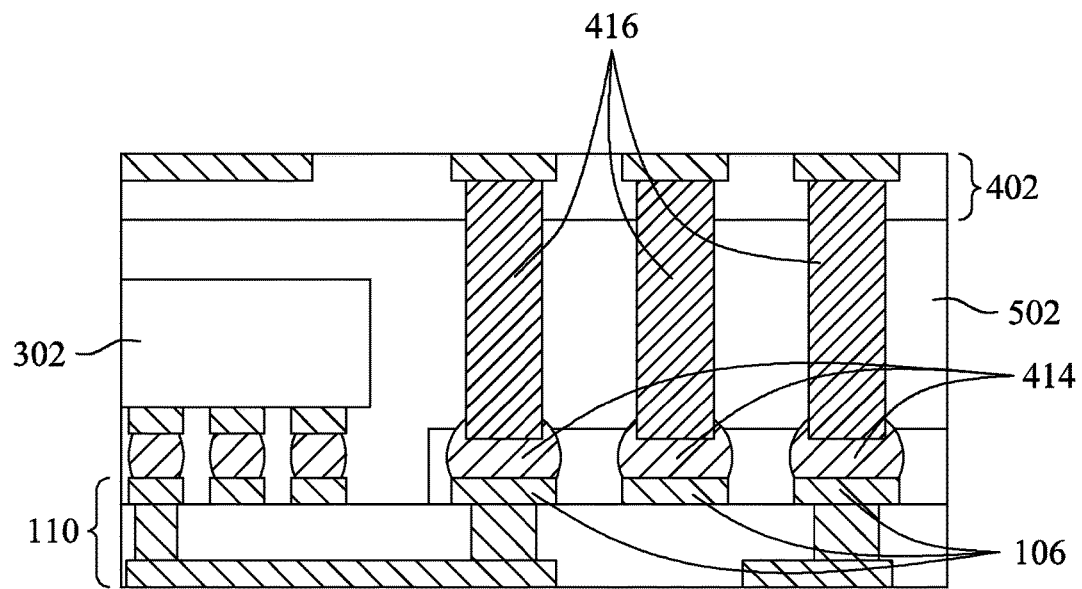

The structures illustrates herein are shown as having pillars 202 disposed on the substrate 110 and on the interposer 402, with the pillars 202 and 416 aligned and joined by the connecting members 414. As illustrated in FIGS. 12A through 12B, in other embodiments, a single pillar 202 or 416 is used and bonded directly to a land 106 or 418 by the connecting member 414. FIG. 12A is a cross-sectional enlarged view illustrating an alternative pillar 202 arrangement according to some embodiments. The pillars 202 are formed on the substrate 110 and extend above the top surface of the die 302. The connecting members 414 bond the pillars 202 to the lands 418 on the bottom surface of the interposer 402.

FIG. 12B is a cross-sectional enlarged view illustrating an alternative pillar 416 arrangement according to some embodiments. The pillars 416 are formed on the interposer 402 and extend below the top surface of the die 302. The connecting members 414 directly bond the pillars 416 to the lands 106 on the top surface of the substrate 110.

Figure 13:
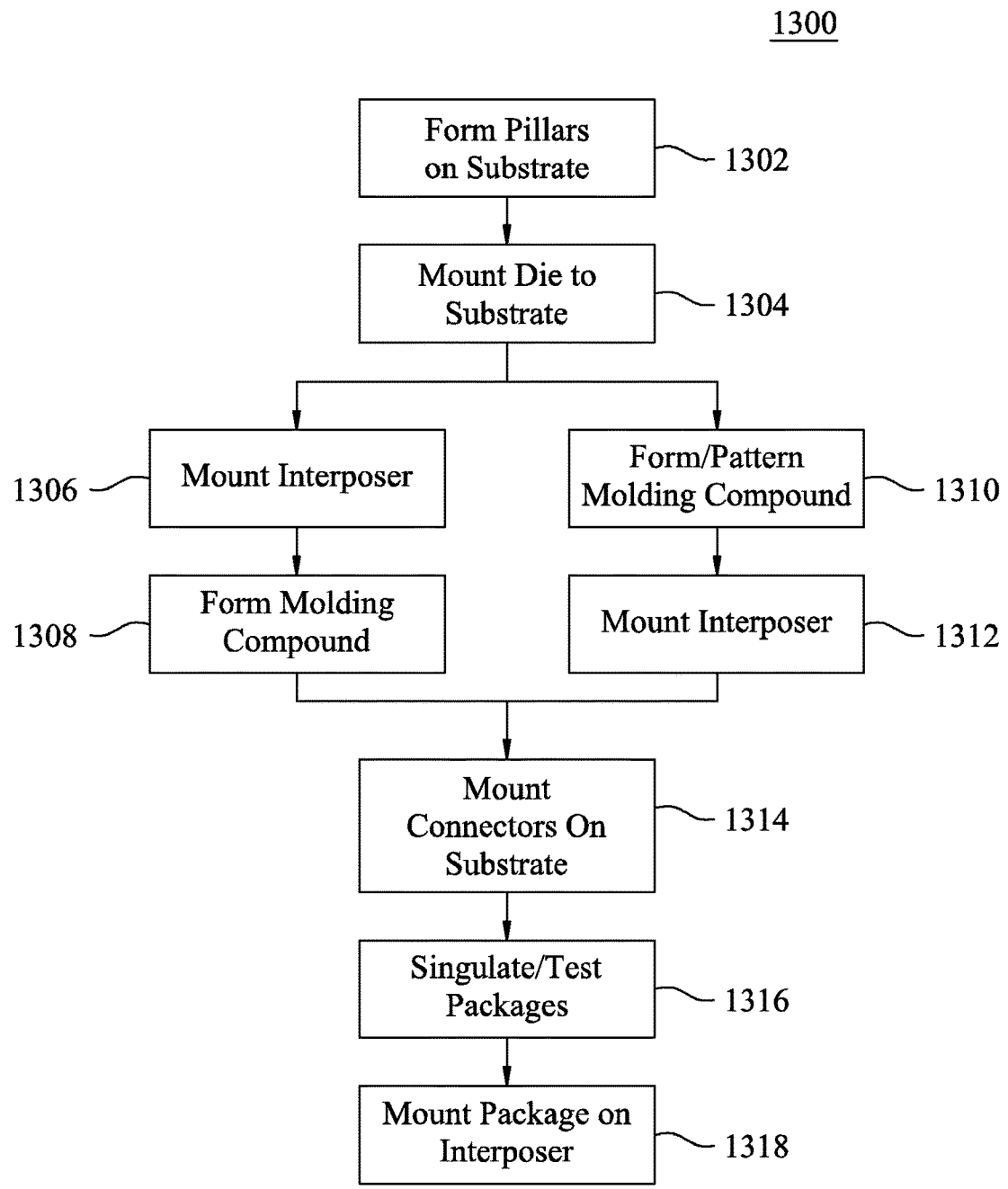
FIG. 13 is a flow diagram illustrating a method for forming a package-on package structure according to some embodiments.

FIG. 13 is a flow diagram illustrating a method 1300 for forming a package-on package structure according to some embodiments. Initially a substrate is formed or provided, and pillars are formed on the substrate in block 1302. A die is mounted on the substrate in block 1304. In an interposer first embodiment, the interposer is mounted on the substrate in block 1306 and the molding compound is formed between the interposer and substrate in block 1308. In an interposer last embodiment, after the die is mounted to the substrate in block 1304, the molding compound is formed over the substrate and patterned in block 1310, and then the interposer is mounted to the substrate in block 1312. Connectors are mounted on the substrate in block 1314 and packages are singulated and tested in block 1316 to identify known good packages. A package is mounted on the substrates that are known good packages in block 1318.

According to an embodiment, a device comprises a substrate having a die mounted on the first side of the substrate and a moldable underfill (MUF) disposed on the first side of the substrate and around the die. An interposer is mounted on the first side of the substrate, with the interposer having lands disposed on a first side of the interposer. The interposer mounted to the substrate by connectors bonded to a second side of the interposer, the connectors providing electrical connectivity between the interposer and the substrate. A package is mounted on the first side of the interposer and is electrically connected to the lands. At least one of the lands is aligned directly over the die and wherein a pitch of the connectors is different than a pitch of the lands.

According to another embodiment, a device comprises a substrate having a die disposed on a first side of the substrate and first pillars disposed on the first side of the substrate. The first pillars have a first pitch. A moldable underfill (MUF) is disposed on the first side of the substrate, with the MUF surrounding the die and each of the first pillars. An interposer is mounted over the first side of the substrate and has lands disposed on a first side of the interposer. The lands have a second pitch greater than the first pitch, and at least one of the lands is aligned directly over the die. Second pillars are disposed on a second side of the interposer, and the second pillars are bonded to the first pillars and provide electrical connectivity between the interposer and the substrate.

A method of forming a device according to an embodiment comprises mounting a die on a first side of a substrate and forming first pillars on the first side of the substrate. A moldable underfill (MUF) is applied on the first side of the substrate and surrounds the die and each of the first pillars. An interposer is mounted on the first side of the substrate by bonding second pillars on a second side of the interposer to the first pillars. The interposer has lands disposed on a first side of the interposer and at least one of the lands is aligned directly over the die. After the mounting the interposer, the first pillars and second pillars provide electrical connectivity between the interposer and the substrate. A package is mounted on the lands and the die is disposed between the first pillars.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
    a substrate having a die mounted on a first side of the substrate;
    a moldable underfill (MUF) disposed on the first side of the substrate, the MUF disposed over and around the die, the MUF comprising a substantially continuous distribution of material over and around the die, the MUF having voids therein, the voids each defined by respective sidewalls of the MUF;
    an interposer mounted on the first side of the substrate, the interposer having lands disposed on a first side of the interposer, and the interposer mounted to the substrate by connectors bonded to a second side of the interposer, the connectors each comprising a first pillar disposed on the first side of the substrate, a second pillar disposed on the second side of the interposer, and a connecting member bonding the first pillar to the second pillar, wherein the connecting member comprises a different conductive material than the first pillar and the second pillar, the connectors providing electrical connectivity between the interposer and the substrate, each of the connectors disposed in a respective void of the MUF, the first pillar and the second pillar of each connector spaced apart from the sidewalls of the MUF defining the respective void, the connecting member contacting the sidewalls of the MUF defining the respective void, the second pillars extending through a protection layer on the second side of the interposer to contact second lands disposed on the second side of the interposer, the protection layer contacting sidewalls of the second pillars, the protection layer having a thickness greater than a thickness of a portion of the MUF extending between the die and the interposer;
    a solder resist layer on the first side of the substrate, the solder resist layer being disposed between the substrate and the MUF, the solder resist layer comprising a first opening, the die being mounted to the substrate through the first opening, wherein the first opening has a width greater than a width of the die, and wherein the first pillars extend through the solder resist layer; and
    a package mounted on the first side of the interposer and electrically connected to the lands, wherein at least one of the lands is aligned directly over the die, and a pitch of the connectors is different than a pitch of the lands.

2. The device of claim 1, wherein the second pillars have a first pitch between about 200 µm and about 400 µm, wherein the lands have a second pitch between about 350 µm and about 650 µm, and the first pitch is less than the second pitch.

3. The device of claim 1, wherein each of the first pillars and the second pillars has a height that is equal to or less than a width of the respective pillar, wherein a first portion of the first pillar is spaced apart from the sidewalls of the MUF, and wherein a second portion of the first pillar contacts the sidewalls of the MUF, wherein the MUF contacts the protection layer, and wherein each of the voids has a conical shape.

4. The device of claim 1, wherein the connecting member is a solder ball.

5. The device of claim 1, wherein a top surface of the MUF is spaced apart from the protection layer, the protection layer contacting sidewalls of the second lands, the protection layer further contacting surfaces of the second lands proximal the die, wherein the die is mounted to the substrate by second connectors bonded to the first side of the substrate, the MUF extending between the die and the substrate and between the second connectors.

6. The device of claim 1, wherein the interposer comprises:
    an organic substrate having a first side and a second side opposite the first side;
    a first redistribution layer on the first side of the organic substrate, the package mounted on the first redistribution layer;
    a second redistribution layer on the second side of the organic substrate, the second redistribution layer comprising the protection layer and the second lands, the second redistribution layer mounted to the substrate by the connectors; and
    vias extending through the organic substrate and electrically connecting the package to the substrate.

7. The device of claim 6, wherein the vias extend through the organic substrate from the first redistribution layer to the second redistribution layer.

8. A device comprising:
    a lower substrate having a die disposed on a first side of the lower substrate;
    first pillars disposed on the first side of the lower substrate, the first pillars comprising a first conductive material, wherein the first pillars have a first pitch;

a moldable underfill (MUF) disposed on the first side of the lower substrate, the MUF comprising a substantially continuous distribution of MUF material over and adjacent the die, wherein the MUF surrounds the die and each of the first pillars;

a solder resist layer between the lower substrate and a portion of the MUF, the first pillars extending through the solder resist layer, wherein a lowermost surface of the MUF is closer to the first side of the lower substrate than an uppermost surface of the solder resist layer;

an interposer mounted over the first side of the lower substrate, the interposer comprising:
an organic substrate having a first side and a second side opposite the first side;
a first redistribution layer on the first side of the organic substrate, the first redistribution layer comprising lands, wherein the lands have a second pitch greater than the first pitch, and wherein at least one of the lands is aligned directly over the die, the first redistribution layer configured for mounting an overlying package, the overlying package comprising an upper substrate;
a second redistribution layer on the second side of the organic substrate, wherein a top surface of the MUF is in contact with the second redistribution layer;
vias extending through the organic substrate and electrically connecting the first redistribution layer to the second redistribution layer; and
second pillars disposed on the second redistribution layer, the second pillars comprising the first conductive material;

conductive connectors bonding the first pillars to the second pillars and providing electrical connectivity between the interposer and the lower substrate, the conductive connectors comprising a second conductive material different from the first conductive material, wherein the second pillars contact the second redistribution layer, and wherein the MUF comprises a single layer of material which surrounds and contacts sidewalls of the first pillars, the second pillars, and the conductive connectors; and a die attach film extending between a top surface of the die and a bottom surface of the second redistribution layer, the die attach film comprising a material different from the material of the MUF, the die attach film having a width equal to a width of the die, the die attach film contacting the die, the second redistribution layer, and the MUF.

9. The device of claim 8, wherein the conductive connectors comprise a solder material, wherein the die is bonded to the lower substrate by second conductive connectors, wherein an underfill comprising a different material than the MUF extends between the die and the lower substrate, and wherein the underfill extends between the second conductive connectors.

10. The device of claim 8, wherein the second pillars have a pitch between about 200 μm and about 400 μm, and the lands have a pitch between about 350 μm and about 650 μm.

11. The device of claim 8, wherein a portion of the MUF is disposed between a bottom surface of the die and a topmost surface of the lower substrate, wherein a second portion of the MUF is disposed between a top surface of the die and a bottom surface of the second redistribution layer, wherein the die is bonded to the lower substrate by second conductive connectors, and wherein the MUF extends between the second conductive connectors.

12. The device of claim 8, wherein the first pillars have a round cross-sectional shape having a diameter of between about 120 μm and about 240 μm.

13. The device of claim 12, wherein the first pillars have a height, the height being less than or equal to the diameter of the first pillars.

14. The device of claim 8, wherein the MUF contacts a first sidewall and a second sidewall of the solder resist layer, and wherein the die is mounted to the lower substrate between the first sidewall and the second sidewall of the solder resist layer.

15. The device of claim 8, further comprising:
a second plurality of conductive connectors bonding the overlying package to the first redistribution layer; and
wire bonds electrically connecting a second die of the overlying package to the upper substrate.

16. A device comprising:
a die mounted on a first side of a substrate;
a moldable underfill (MUF) disposed on the first side of the substrate, the MUF comprising a continuous distribution of MUF material laterally adjoining the die, an upper most surface of the die being free from the MUF material;
an interposer mounted on the first side of the substrate, the interposer comprising:
an organic substrate having a first side and a second side opposite the first side;
a first redistribution layer on the first side of the organic substrate, the first redistribution layer comprising lands disposed on the first redistribution layer;
a second redistribution layer on the second side of the organic substrate, the interposer mounted to the substrate by connectors bonded to the second redistribution layer, the connectors providing electrical connectivity between the interposer and the substrate, the connectors having a first spacing between adjacent connectors, the lands having a second spacing between adjacent lands, wherein the connectors comprise first pillars disposed on the first side of the substrate, second pillars disposed on the second side of the organic substrate, and connecting members bonding each of the first pillars to a respective one of the second pillars, wherein the connecting members are a different conductive material than the first pillars and the second pillars, wherein the MUF comprises a single layer contacting the first pillars, the second pillars, and the connecting members; and
vias extending through the organic substrate and electrically connecting the first redistribution layer to the second redistribution layer;
a die attach film extending from the upper most surface of the die to the second redistribution layer, the die attach film comprising a different material from the MUF, the MUF extending along and contacting opposite sidewalls of the die attach film; and
a package mounted on the first side of the interposer and electrically connected to the lands, wherein at least one of the lands is directly over the die, wherein the first spacing is different than the second spacing.

17. The device of claim 16, wherein a top surface of the MUF is spaced apart from the second side of the organic substrate.

18. The device of claim 16, wherein the first pillars are copper, the second pillars are copper, and the connecting members are solder.

19. The device of claim 16, wherein the second redistribution comprises second lands disposed in a protective layer, the second pillars extend through the protective layer to contact a first surface of the second lands, the protective layer contacting a remainder of the first surface of the second lands, the protective layer contacting sidewalls of the second lands, and the protective layer contacting sidewalls of the second pillars.

20. The device of claim 16, wherein the die attach film has a width equal to a width of the die.

\* \* \* \* \*